United States Patent [19]

Loszewski

[11] Patent Number: 4,898,778
[45] Date of Patent: Feb. 6, 1990

[54] SILICON CARBIDE MONOFILAMENTS FOR IMPROVED COMPOSITE PROPERTIES AND METHOD

[75] Inventor: Raymond C. Loszewski, Windham, N.H.

[73] Assignee: AVCO Corporation, Providence, R.I.

[21] Appl. No.: 276,797

[22] Filed: Nov. 28, 1988

[51] Int. Cl.⁴ .......................... B32B 9/00; D02G 3/00
[52] U.S. Cl. ..................................... 428/368; 428/367; 428/373; 428/375; 428/391; 428/212
[58] Field of Search .............. 428/367, 373, 375, 368, 428/391

[56] References Cited
U.S. PATENT DOCUMENTS

| | | | |
|---|---|---|---|
| 3,850,689 | 4/1970 | Basche | 428/379 |
| 4,068,037 | 1/1978 | Debolt | 428/368 |
| 4,315,968 | 2/1982 | Suplinskas | 428/391 |
| 4,340,636 | 7/1982 | Debolt | 428/215 |
| 4,373,006 | 2/1983 | Galasso | 428/375 |
| 4,628,002 | 12/1986 | Suplinskas | 428/375 |

Primary Examiner—George F. Lesmes
Assistant Examiner—Jill M. Gray
Attorney, Agent, or Firm—Abraham Ogman

[57] ABSTRACT

A high strength silicon carbide monofilament which has a core and a stoichiometric bulk layer of silicon carbide deposited on the core having an exterior surface and a core bulk layer interface, the bulk layer having an average grain size of less than 200 nanometers which size varies continuously across the cross section of the bulk layer, the variation comprising a first average grain size at the interface which increases to a maximum average grain size intermediate the interface and the exterior surface and then decreases to the minimum at the exterior surface. In an alternate embodiment a surface layer is deposited on the bulk layer of silicon carbide. A preferred method of making the silicon carbide monofilament is also presented.

11 Claims, 2 Drawing Sheets

SILICON CARBIDE MONOFILAMENTS FOR IMPROVED COMPOSITE PROPERTIES AND METHOD

BACKGROUND OF THE INVENTION

The invention is grounded in the art of high-strength, high-modulus silicon carbide (SiC) monofilaments. Definitions:

1. A silicon carbide (SiC) monofilament is a monofilament that derives its properties from a bulk layer of essentially stoichiometric SiC.

2. An outer layer or surface layer is an extensive layer of material deposited on a SiC monofilament. A surface layer may be deposited directly on the bulk layer or on an intermediate buffer layer of material positioned between the bulk layer and the surface layer.

3. For purposes of this invention, the term "fine grain SiC" shall apply to polycrystalline SiC crystals with diameters or widths of less than about 200 nanometers ($10^{-9}$ meters) and preferably less than between about 100–150 nanometers and a length of less than about 4 microns.

Typically, these monofilaments exhibit minimum tensile strengths in excess of 300,000 pounds per square inch (psi) and bending or Young's modulus in excess of 30 million psi.

The heretofore baseline 5.6 Mil Diameter monofilament has a tensile strength in the vicinity of 350–450 thousand psi and a bending modulus of $55$-$60 \times 10^6$ psi.

The field of technology defined as high-strength, high-modulus monofilaments is unique and ultracritical to changes in structure or process of manufacture.

Persons skilled in the art of high-strength, high-modulus filaments have observed that it is frequently not possible to predict what effect changes in compositions, processes, feedstocks, or post-treatments will have on the properties of this unique family of filaments.

Boron nitride, boron carbide, titanium nitride, titanium carbide, and tungsten in combination with boron or silicon carbide monofilaments in specific applications have failed to provide a useful monofilament, though in each instance, the candidate material was chosen to enhance one or more properties of the high-strength monofilament.

One form of a silicon carbide surface layer on a silicon carbide monofilament would not protect the filament from degradation unless the coating had a critical cross-section profile. See U.S. Pat. Nos. 4,340,636 and 4,415,609.

Carbon cores heretofore required buffer layers deposited at critical specific temperatures. See U.S. Pat. No. 4,142,008.

Forms of carbon-rich silicon carbide surface layers which create and protect high tensile strengths of silicon carbide monofilaments were found to form ineffective metal matrix and resin matrix composite materials. See U.S. Pat. Nos. 4,340,636 and 4,415,609.

Recrystallization of fine grain structures occurs at one temperature. After 5 seconds of exposure to the temperature, the filament loses 50 percent of its strength. Exposure to a temperature on the order of 2 percent lower showed no subsequent degradation.

Critical crystal morphology of a carbon-rich region in a silicon carbide filament was found to improve machinability of silicon carbide reinforced composites. Proper claim structure defined the difference between a commercially viable and non commercially viable monofilament.

Other structural or manufacturing procedural features which were found to be of a critical nature are change in core composition and surface texture, the presence or absence of a buffer layer of specific compositions, impurities, and reactivity of a surface coating with matrix material.

SiC Monofilaments

The basic SiC monofilament comprises a core, generally of carbon or tungsten, about 0.5 to 1.5 mils in diameter upon which a thick stoichiometric SiC coating commonly called the bulk layer or bulk SiC is deposited.

To improve or tailor properties, intermediate layers and surface treatments in many forms have been tried and used. U.S. Pat. No. 4,340,636 referred to previously depicts what is considered the baseline commercial SiC monofilament commonly called SCS-2 monofilament It contains a carbon-rich intermediate buffer layer between the core and bulk layer.

U.S. Pat. No. 4,628,002 is directed to providing a silicon carbide monofilament having an improved transverse strain to failure ratio. The SiC monofilament is first provided with a layer of bulk SiC. There is deposited on the bulk SiC a thin layer of fine grain SiC and finally a surface layer or zone in which the Si/C ratio decreases then increases to provide a surface essentially of pure silicon. Each layer performs a critical function necessary to achieve the improved transverse strain to failure ratio.

Monofilaments containing solely a bulk layer, absent the discontinuity, deposited on a core are known to have been made. The crystal structure of these bulk layers is either unknown or significantly different from that disclosed and claimed herein.

The foregoing discussion is provided to emphasize that even small variations in structure and/or processing can lead to unexpected and/or critical improvement.

OBJECTIVES OF THE INVENTION

It is an object of the present invention to provide an improved SiC monofilament structure and method which avoids the limitations and disadvantages of prior SiC structures and methods.

Another object of the present invention is to provide a SiC monofilament structure which results in higher composite transverse strength and machinability.

A still further object is to provide a SiC monofilament with a bulk layer having a graded continuously changing fine crystal grain structure.

It is yet another object of the invention to provide a bulk layer having a graded fine grain cross section.

A still further object of the present invention is to provide a new and improved method of depositing a fine grain SiC bulk layer or region.

It is another object of the invention to provide a method for producing a commercially viable fine grained SiC bulk layer in a single pass to produce a continuously variable fine grain crystal structure.

These and other objects of the invention will in part appear hereinafter and will in part become apparent after consideration of the specification with reference to the accompanying drawings and the claims.

SUMMARY OF THE INVENTION

The present invention comprises a unique SiC bulk layer for SiC monofilaments and a new and improved method of depositing the SiC bulk layer on a filament core. Briefly, the bulk layer comprises a stoichiometric bulk layer of SiC deposited on a core filament, the bulk layer being characterized by an over all average grain size of about 90–100 nanometers (nm) and which varies across the cross section of the bulk layer from a first average grain size at the interface with the core which increases to a maximum average grain size intermediate the interface and the exterior surface. The method of forming the fine grain SiC stoichiometric bulk layer comprises generally vapor depositing a stoichiometric layer of SiC on a heated filament core which moves from an inlet port to an exit port of a reactor.

As briefly stated, the method comprises resistively heating the entering filament while orchestrating the temperature, concentration and volume of reagents introduced at the input to the reactor to provide a deposition temperature of about 1000° C. or less to start the deposition process. The temperature of the monofilament is then permitted to increase to about 1500° C. intermediate the input and exit ports of the reactor, and thereafter the deposition temperature is permitted to decrease to about 1200° C. at the exit port of the reactor. In an alternate embodiment, the method includes the additional step of supplying additional inert or reducing gas to cool the monofilament to 1000° C. or less as the coated core moves to exit the reactor to provide a minimum average grain size at the exterior surface of SiC bulk layer.

The variation in the size of the crystals is continuous. That is to say, there is no discontinuity in the rate of the increase or the decrease of crystal growth.

BRIEF DESCRIPTION OF THE DRAWINGS

For a fuller understanding of the nature and desired objects of the present invention, reference should be made to the following detailed description taken in conjunction with the accompanying drawings wherein like reference characters denote corresponding parts throughout several views and wherein.

DESCRIPTION OF PREFERRED EMBODIMENTS

Figure 1:
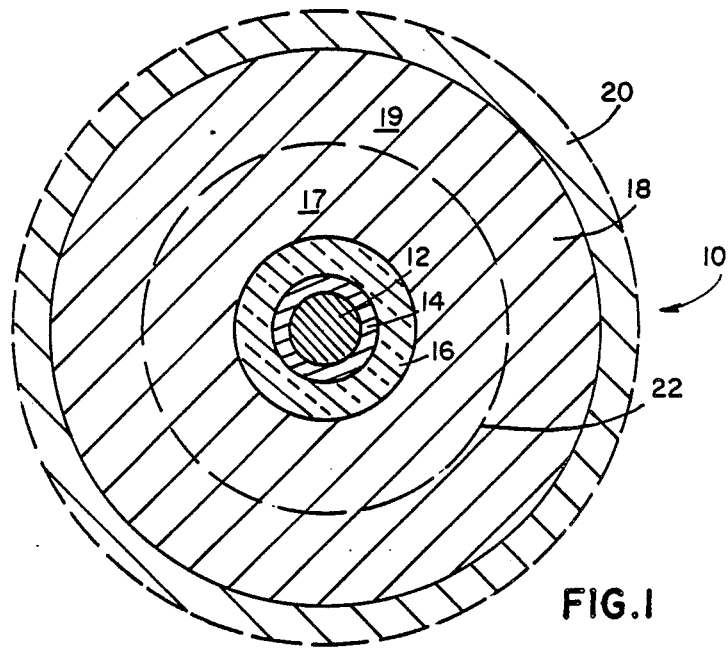
FIG. 1 is a cross sectional representation of a commercial silicon carbide (SiC) monofilament.

Referring to FIG. 1, there is shown a cross section of a commercial silicon carbide (SiC) monofilament 10. The monofilament contains a core 12 which may be, for example, carbon or tungsten. There is deposited on the core in sequence a pyrolytic graphite layer 14, a carbon rich SiC layer 16 and a stoichiometric bulk layer 18. Generally, there is deposited on the bulk layer a surface layer 20 of the type described in U.S. Pat. Nos. 4,315,968 and 4,415,609 assigned to the same assignee as this invention. In one configuration as disclosed in U.S. Pat. No. 4,628,002 assigned to the same assignee as this invention, a so called amorphous layer of SiC is interposed between the bulk layer 18 and the surface layer 20. One example of a surface layer is one wherein the carbon to silicon carbide ratio varies across the cross section of the surface layer from a value of 1 at the interface of the stoichiometric layer and the surface layer to about 0.20 at an intermediate point within the surface layer to about 0.50 at the exterior surface of the surface layer.

In these conventional monofilaments 10 there is a discontinuity 22 defined in the bulk layer 18 brought about by use of two reactors. A similar discontinuity will be produced between multiple layers in one reactor having separate deposition zones. The first reactor deposits the pyrolytic graphite layer 14, the carbon rich layer 16 and the first portion 17 of the bulk layer 18. The second reactor deposits the second portion 19 of the bulk layer 18 and the surface layer 20. The discontinuity as represented by the dashed line 22 between layer 16 and layer 18 represents a stress concentration region where most transverse failures of the monofilament such as transverse splitting occurs.

Figure 2:
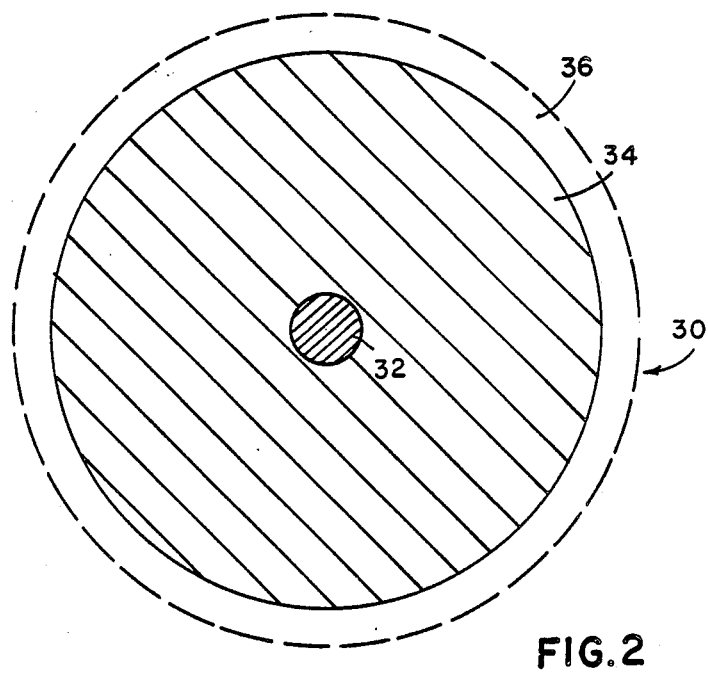
FIG. 2 is a cross sectional representation of a SiC monofilament embodying the principals of the present invention.

Referring to FIG. 2, there is shown a cross section of a SiC monofilament 30 embodying the principles of the invention. The monofilament 30 of FIG. 2 includes a core 32 and a bulk layer 34 of stoichiometric SiC on the core 32. The bulk layer 34 is almost free of excess carbon. A surface layer 36 is also shown on the monofilament 30 although this is not essential as will be noted hereinafter. The bulk layer 34 in one configuration has a unique distribution of average grain sizes as a function of the buildup of the bulk layer 34. In general, however, the bulk layer 34 is distinguishable from prior monofilaments by a continuously graded grain size with no discontinuities.

Figures 3, 3A:
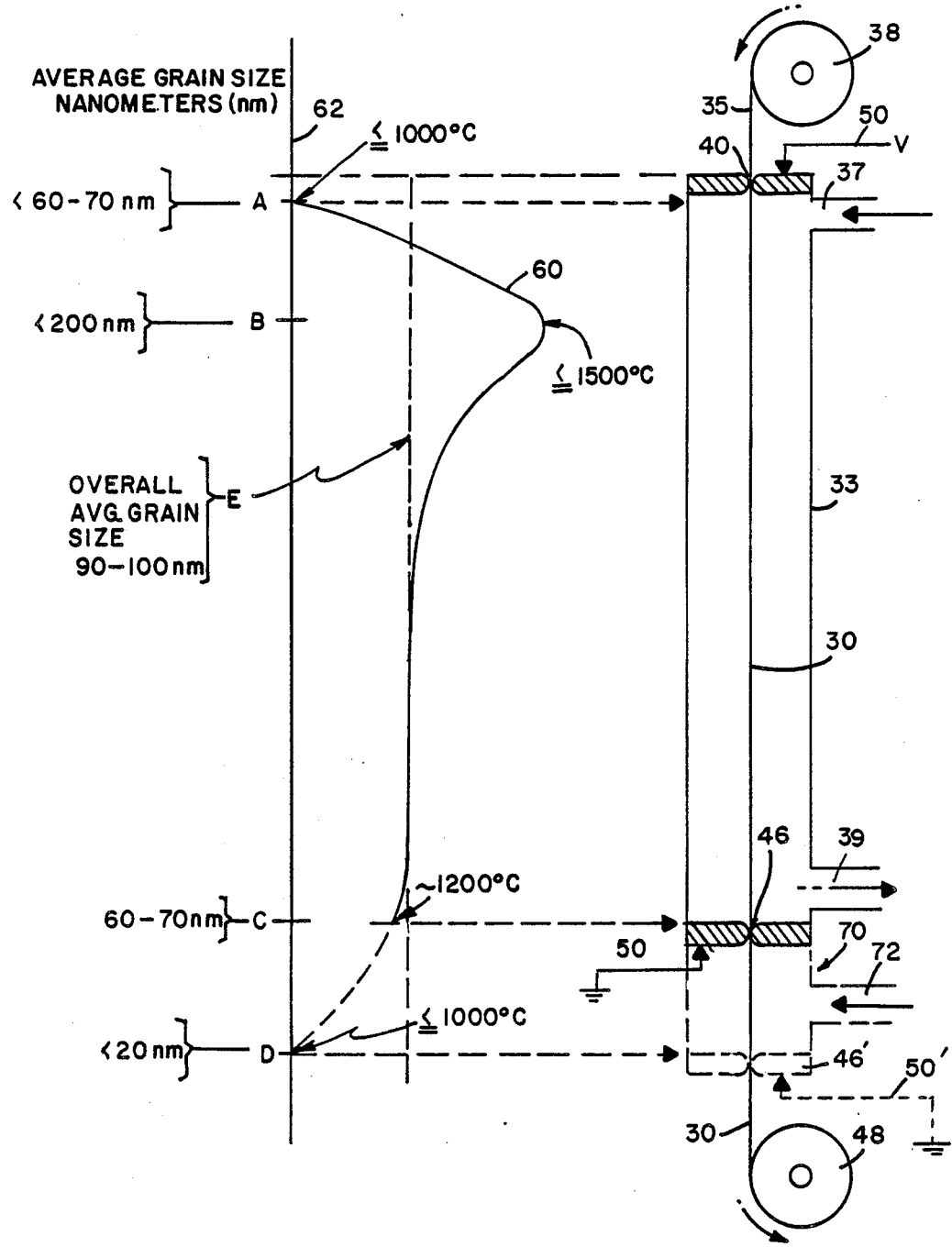
FIG. 3 is a schematic representation of a reactor for making the SiC filament.
FIG. 3A is a schematic representation temperature profile of the monofilament within the reactor as shown to the right of the vertical line together with the average crystal size at discrete points of the reactor as shown to the left of the vertical line.

Referring to FIG. 3, the coated monofilament 30 is preferably made in an elongated reactor 33 having an input port 37 and an exit port 39. A monofilament core 35 is supplied to the reactor 33 from a spool 38 threaded through a jewel orifice 40 into the body of the reactor 33.

In the FIG. 3 illustration, the core 35 and monofilament 30 are heated by passing an electric current, from a source 50, through the core and monofilament. Temperature control, either generally or locally, may also be provided by induction heat, convection cooling or lasers, etc.

The heated core traverses through the reactor where it contacts reagents entering port 37. The reagents decompose and deposit SiC on the core as it moves toward jewel orifice 46. The coated core or SiC monofilament 30 is collected on the spool 48. Spent reagents exit from exit port 39.

A specific sequence of events are orchestrated within the reactor 33 to produce the unique crystal structure which is the subject of this invention.

One method of practicing the invention without auxiliary heating apparatus to control the temperature profile of the monofilament is illustrated and described in relation to FIGS. 3 and 3A.

Referring to FIG. 3A, the temperature profile 60 of the monofilament within the reactor is shown to the right of the vertical line 62. The average crystal size at discrete points of reactor is shown to the left of vertical line 62. In general, the crystal size is proportional to the deposition temperature all other variables being kept constant.

The deposition starts immediately after the core 35 leaves or passes the jewel orifice 40. The entering filament is heated while a predetermined concentration and volume of reagents is introduced through the input port 37 which together provide an initial deposition temperature at or below 1000° C. Accordingly, the initial deposition is made to occur at or below 1000° C. Thereafter the monofilament temperature is permitted to rise rapidly to about 1400° C., with a maximum at or below 1500° C., at an intermediate point of its travel. It then reduces gradually to a near asymptopic 1200° C. adjacent to the jewel orifice 46. The monofilament 30 is then quenched by the Jewel orifice 46 to below 1000° C.

The crystals throughout the bulk layer 34 are very fine. The preferred size distribution is shown to the left of the vertical line 62 in FIG. 3A. The over all average size of the SiC crystals deposited on the core is about 90–100 nanometers as represented by the dashed line E. The first average crystal size is at point A or less than 60–70 nanometers and less than 20 nanometers. The maximum average crystal size occurs at point B or less than about 200 nanometers. The average crystal size then gradually drops off to about 60 to 70 nanometers at point C.

When it is desired to avoid using the surface layer, the temperature of the monofilament is tempered or decreased more slowly than by quenching. At 70 in FIG. 3, there is shown a dotted elongation of the reactor 33. The dotted elongation includes a second input port 72 before the jewel orifice 46' which is moved from position 46 to 46' since a single pass through the reactor is required. Hydrogen is fed into the second input port 72 to control or temper the cooling of the monofilament to below 1000° C. less precipitously than occurs at C without the added reactor length as discussed further hereinafter.

The grain size profile is produced and maintained by orchestrating the temperature profile. This may be done by any of the known methods such as altering the heat conductivity, induction heating, convective cooling, laser heating. The following factors are considered in orchestrating the temperature profile to obtain the desired grain size. The reagents supplied to the reactor are a mixture of chlorosilanes and hydrogen. Specifically, a typical silane mixture would be 78% dimethyldichlorosilane, 6% methyldichlorosilane, 1–2% methyltrichlorosilane and the remainder a complex mixture of silanes, by weight. The ratio of silane to hydrogen is 28% silane to 72% hydrogen. As described previously, an initial deposition temperature equal to or below 1000° C. is provided at "A" in the vicinity of the jewel orifice 40. Thereafter, adjustments are made, which may include the filament speed and length of the reactor, so that the subsequent increase in temperature to the temperature at "B" and the gradual decrease in temperature that follows is controlled. The following internal factors are also considered in the control of the temperature profile. The reagents are heated by the monofilament so that the initial temperature of the reagents is affected. The degradation of the chlorosilanes is exothermic whereby additional heat is added to the system. Additionally, the monofilament grows and its surface area as well as its thickness increases which, as determined, affects its resistance and temperature. Also, the deposition process slows as the chlorosilane is used and less heat is added to the process. This combination of factors causes the gradual cooling in the "B" to "C" area to the near asymptopic configuration just ahead of "C". The reagents leave the reactor through the exit port 39 while the monofilament is quenched by the jewel orifice 46 to below 1000° C. The quenching by the jewel orifice 46 is precipitous so that an imperceptable amount of deposit occurs between the exit port 39 and the jewel orifice 46.

The tempering that occurs between "C" and "D" mentioned previously is preferred where a fine average crystal size of about 20 nanometers or less is desired at the exterior of the bulk layer 18. As discussed previously, the added cooling is accomplished by supplying additional hydrogen gas at the second input port 72 in the extended version of the reactor at 70. The thickness of the deposit in the C-D area is essentially imperceptable. The average grain size in this region was nevertheless measured at less than 20 nanometers. It can be appreciated that the crystal size that occurs at "A" in the initial deposition is similar to and approaches the crystal size that occurs between "C" and "D" since the temperature profile which controls the grain size is similar.

The net result of the foregoing is a commercially viable SiC monofilament made by means of a single pass through a reactor. Typically the monofilament will have 350 to 450 ksi tensile strength.

When placed into a composite and subjected to transverse stress, the failures occur outside of the bulk layer. The monofilament strength holds together when machined.

While the invention has been described with respect to preferred embodiments, it will be apparent to those skilled in the art that changes and modifications may be made without departing from the scope of the invention herein involved in its broader aspects. Accordingly, it is intended that all matter contained in the above description, or shown in the accompanying drawing shall be interpreted as illustrative and not in limiting sense.

What is claimed is:

1. A high strength silicon carbide monofilament comprising:
   a core; and
   a stoichiometric bulk layer of silicon carbide deposited on the core, said bulk layer being further defined by a fine grain structure where the grain size continuously varies across the cross section and where the average grain size increases from the interface of the core and the bulk layer through a single peak of maximum average grain size intermediate the interface and the exterior surface of the bulk layer and then decreases to a second average grain size at the exterior surface of the bulk layer, the maximum grain size being less than 200 nanometers and the over all average grain size is between 90 and 100 nanometers.

2. A high strength silicon carbide monofilament comprising:
   a core;
   a stoichiometric bulk layer of silicon carbide deposited on the core said bulk layer having an exterior surface and an interface formed by the core and the bulk layer, said bulk layer being further defined by an average grain size of less than 200 nanometers which size varies continuously without discontinuity across the cross section of the bulk layer, said variations comprising a first average grain size at the interface which increases to a maximum average grain size intermediate the interface and the exterior surface of the bulk layer and then decreases to an intermediate grain size less than the maximum but more than the first average grain size at the exterior surface of the bulk layer.

3. A high strength monofilament as defined in claim 2 wherein the first average grain size is less than 60 to 70 nanometers, the maximum average grain size is less than 200 nanometers and the intermediate average grain size is about 60 to 70 nanometers.

4. A high strength monofilament as defined in claim 2 wherein the first average grain size is less than 60 to 70 nanometers and the intermediate average grain size is 60–70 nanometers.

5. A high strength monofilament as defined in claim 2 having a minimum tensile strength of between 350 to 450 ksi.

6. A high strength monofilament as defined in claim 2 wherein the decrease in average grain size adjacent to the exterior surface of the stoichiometric bulk layer is asymptotic.

7. A high strength silicon carbide monofilament comprising:
a core;
a stoichiometric bulk layer of silicon carbide deposited on the core said bulk layer having an exterior surface and an interface formed by the core and the bulk layer, said bulk layer being further defined by a maximum grain size of 200 nanometers which size continuously varies without discontinuity across the cross section of the bulk layer, said variation comprising a first average grain size at the interface which increases to a maximum average grain size intermediate the interface and the exterior surface of the bulk layer and then decreases to about the first average grain size at the exterior surface of the bulk layer.

8. A high strength silicon carbide monofilament as defined in claim 7 where the first average grain size and the grain size at the exterior surface is about 20 nanometers.

9. A high strength silicon carbide monofilament as defined in claim 7 where the average grain size decreases from the maximum grain size asymptotically to about 60 to 70 nanometers and then drops to about the first average grain size at the exterior surface of the bulk layer.

10. A high strength silicon carbide monofilament as defined in claim 9 where the first average grain size is less than 60–70 nanometers.

11. A high strength silicon carbide monofilament as defined in claim 9 where the over all average grain size is 90 to 100 nanometers.

* * * * *